(12) United States Patent
Elwany (10) Patent No.: US 8,184,434 B2
(45) Date of Patent: May 22, 2012

(54) VIDEO/AUDIO COMPUTER DISPLAY PROCESSOR

(75) Inventor: Magdy Elwany, Dallas, TX (US)

(73) Assignee: M & A Technology Inc., Carrollton, TX (US)

( * ) Notice: Subject to any disclaimer, the term of this patent is extended or adjusted under 35 U.S.C. 154(b) by 107 days.

(21) Appl. No.: 12/859,710

(22) Filed: Aug. 19, 2010

(65) Prior Publication Data
US 2012/0044630 A1  Feb. 23, 2012

(51) Int. Cl.
*H05K 7/20* (2006.01)
(52) U.S. Cl. ............ 361/695; 361/679.49; 361/694
(58) Field of Classification Search ............ 361/679.49, 361/695
See application file for complete search history.

(56) References Cited

U.S. PATENT DOCUMENTS

| | | | |
|---|---|---|---|
| 7,298,615 B2 * | 11/2007 | Wong | 361/679.48 |
| 7,593,223 B2 * | 9/2009 | Kobayashi | 361/679.5 |
| 7,733,649 B2 * | 6/2010 | Anderl et al. | 361/695 |
| 7,768,781 B2 * | 8/2010 | Makley et al. | 361/695 |
| 2006/0120045 A1 * | 6/2006 | Van Der Werff | 361/697 |
| 2007/0035925 A1 * | 2/2007 | Kobayashi | 361/688 |

* cited by examiner

*Primary Examiner* — Gregory Thompson (57) ABSTRACT

A video/audio computer display processor comprising a chassis, a video processor, a graphics card, and a ventilation duct. The chassis has first, second and third fans mounted therein and the video processor has a processor heatsink mounted thereon, wherein the processor heatsink has fins extending therefrom. The first fan is mounted on the processor heatsink and the second fan is positioned to direct an airflow parallel to and along the fins of the processor heatsink. The graphics card has a graphics card heatsink mounted thereon, and the graphics card heatsink has fins extending therefrom. The ventilation duct extends along a side of the chassis and has an opening therein adjacent the graphics card heatsink. The third fan is positioned to direct airflow through the ventilation duct, out through the opening and parallel to and along the fins of the graphics card heatsink.

21 Claims, 10 Drawing Sheets

VIDEO/AUDIO COMPUTER DISPLAY PROCESSOR

TECHNICAL FIELD

This application is directed, in general, to a video/audio display processor and, more specifically, to a video/audio display processor mountable on a back of a large screen video display.

BACKGROUND

Today there are many applications for extremely large video/audio displays, e.g., outdoor television displays, instant on-scene sporting event displays, sports bars, etc. Generally speaking, the larger these displays, the larger the power requirement and computational processing required. As the power increases, so does the heat generated by the display processor. Therefore, suitable cooling must be provided for the microprocessor and the graphics card/processor to prevent system failure from overheating. With the need to keep the display processor as compact as possible, the display processor chassis is quite cramped, further concentrating the heat generated. Often the display processor is mounted to the back of the video display, therefore concentrating the heat near the elements, e.g., LCD, plasma, etc., that display the video picture. This concentration of heat may shorten the life of the display if not properly dissipated.

What is needed in the art is a video/audio chassis with a mounting bracket that can be attached to the back of a large video display while appropriately directing the heat generated by the processor and graphics card/processor away from the video display.

SUMMARY

One aspect provides a video/audio computer display processor comprising a chassis, a video processor, a graphics card, and a ventilation duct. The chassis has first, second and third fans mounted therein and the video processor has a processor heatsink mounted thereon, wherein the processor heatsink has fins extending therefrom. The first fan is mounted on the processor heatsink and the second fan is positioned to direct an airflow parallel to and along the fins of the processor heatsink. The graphics card has a graphics card heatsink mounted thereon, and the graphics card heatsink has fins extending therefrom. The ventilation duct extends along a side of the chassis and has an opening therein adjacent the graphics card heatsink. The third fan is positioned to direct airflow through the ventilation duct, out through the opening and parallel to and along the fins of the graphics card heatsink.

Another aspect provides a method of manufacturing a video/audio computer display processor comprising providing a chassis and mounting a video processor with a heatsink having fins extending therefrom, a graphics card with a heatsink having fins extending therefrom, and a ventilation duct in the chassis. A first fan is mounted on the processor heatsink and a second fan is mounted to direct an airflow parallel to and along the fins of the processor heatsink. A ventilation duct is mounted to extend along a side of the chassis with the ventilation duct having an opening therein adjacent the graphics card heatsink. A third fan is mounted to direct airflow through the ventilation duct and out through the opening and parallel to and along fins of the graphics card heatsink.

A further aspect provides a video/audio computer display processor system comprising a chassis, a video processor, a graphics card, a ventilation duct, and a mounting bracket. The video processor has a processor heatsink mounted thereon that has fins extending therefrom. The first fan is mounted on the processor heatsink and the second fan is positioned to direct an airflow parallel to and along the fins of the processor heatsink. The graphics card has a graphics card heatsink mounted thereon, wherein the graphics card heatsink has fins extending therefrom. The ventilation duct extends along a side of the chassis and the ventilation duct has an opening therein adjacent the graphics card heatsink. The third fan is positioned to direct airflow through the ventilation duct and out through the opening and parallel to and along fins of the graphics card heatsink. The mounting bracket comprises a frame configured to receive the chassis therewithin, and a mounting plate configured to fasten the mounting bracket to a back of a video/audio computer display.

BRIEF DESCRIPTION

Reference is now made to the following descriptions taken in conjunction with the accompanying drawings, in which.

DETAILED DESCRIPTION

Figure 1A:
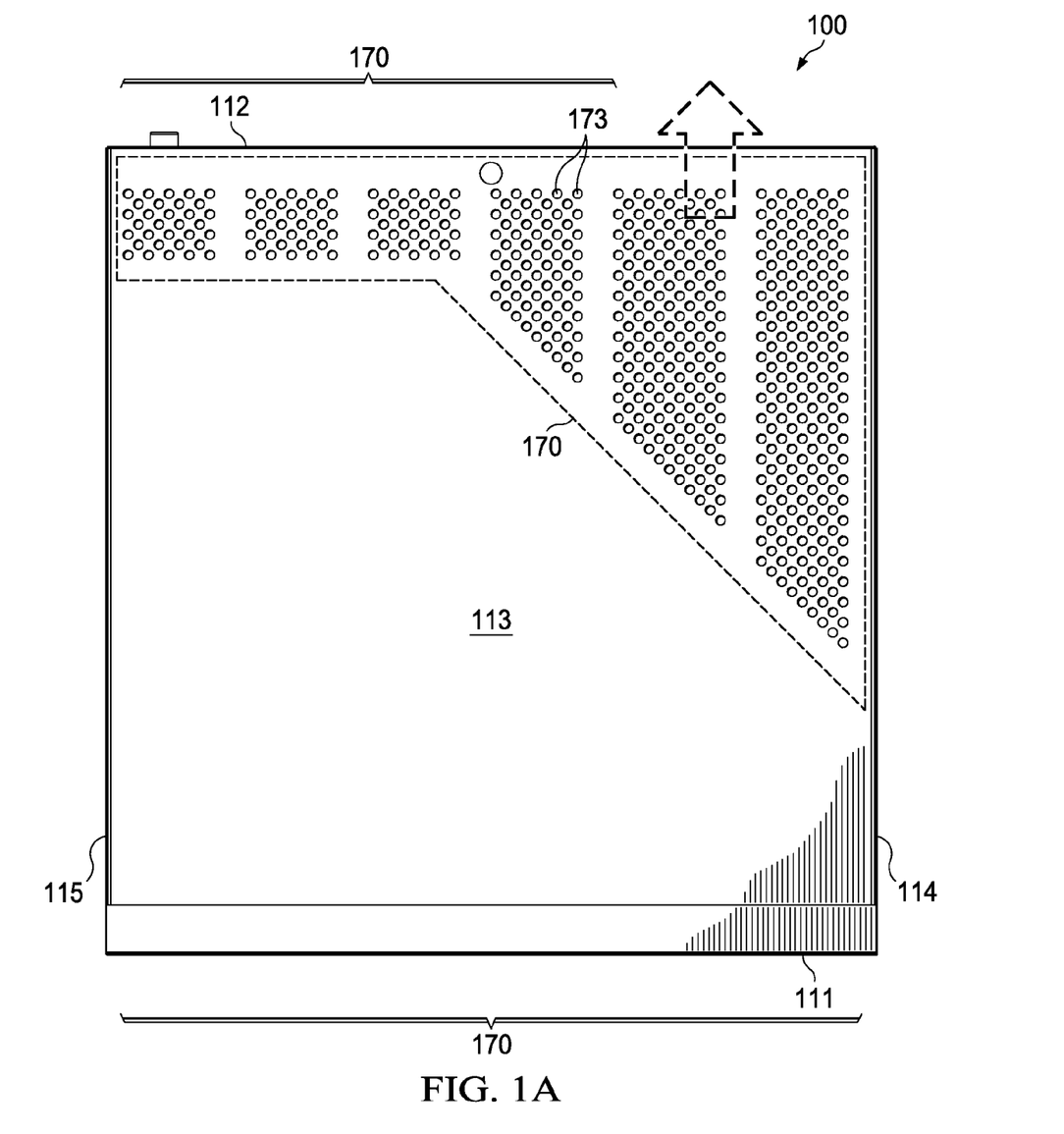
FIG. 1A is a top plan view of one embodiment of a video/audio computer display processor constructed according to the principles of the present invention.
Figure 1B:
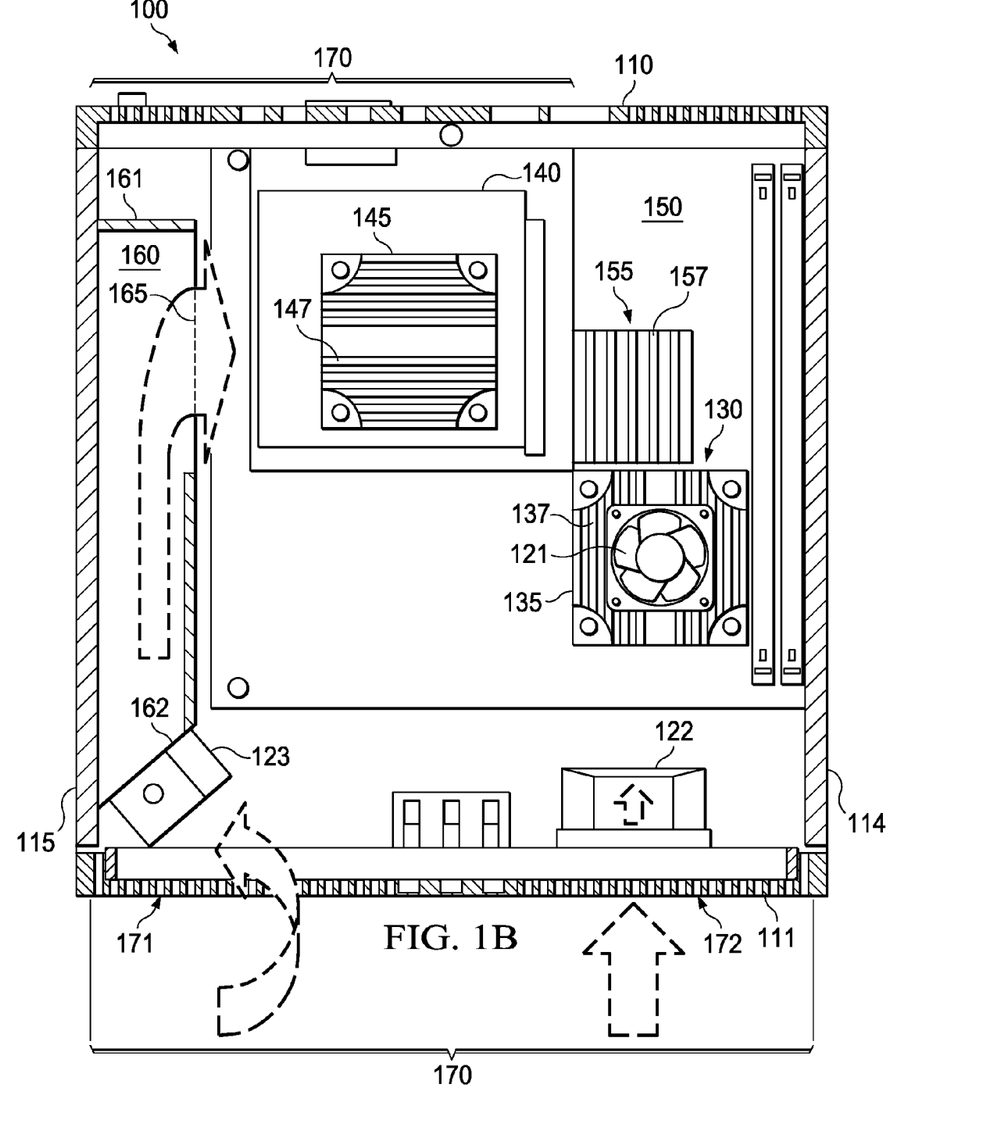
FIG. 1B is a plan sectional view of the video/audio computer display processor of FIG. 1.

Referring initially to FIGS. 1A and 1B, illustrated are a top plan view and a plan sectional view, respectively, of one embodiment of a video/audio computer display processor 100 constructed according to the principles of the present invention. The video/audio computer display processor 100 comprises a chassis 110; first, second, and third fans 121, 122, 123, respectively; a video processor 130; a video processor heatsink 135; a graphics card 140; a graphics card heatsink 145, a motherboard 150; a motherboard heatsink 155 and a duct 160. The chassis 110 has ventilation apertures 170 on a front side 111, a back side 112, and top side 113 thereof. The chassis 110 additionally has a right side 114 and a left side 115. The video processor heatsink 135, graphics card heatsink 145 and motherboard heatsink 155 each have a plurality of parallel fins 137, 147, 157, respectively, to facilitate in heat dispersion from their respective electronics. For the purposes of this disclosure, the term "fin" is defined as any extension outwardly from a base of a heatsink in which the extension comprises a continuous projection, a series of discontinuous projections in a generally singular direction along the surface of the heatsink, a series of posts or cones projecting in a generally singular direction along the surface of the heatsink, or any similar configuration that generally increases the surface area of the heatsink so as to dissipate heat.

The video processor heatsink 135 is mounted on the video processor 130 and the first fan 121 is mounted on the video processor heatsink 135. The second fan 122 is positioned to direct airflow from outside of the chassis 110 through a second portion 172 of front side apertures 170 then parallel to and along fins 137 of the processor heatsink 135 and the fins 157 of the motherboard heatsink 157. The ventilation duct 160 is mounted along one side 115 of the chassis 110 and has an opening 165 proximate a first end 161 of the ventilation duct 160. The third fan 123 is mounted on a second end 162 of the ventilation duct 160 at an angle of less than 90° to the long axis of the ventilation duct 160. Airflow is drawn in by the third fan 123 through a first portion 171 of front side apertures 170 in the chassis 110 and is directed through the ventilation duct 160 and out the opening 165 thence parallel to and along fins 147 of the graphics card heatsink 145 and mixes with airflow from the second fan 122 in the vicinity of the motherboard heatsink 155 exiting the chassis 110 primarily through the top side apertures 173. Some airflow may exit the chassis through ventilation apertures 170 in the back side 112. In a preferred embodiment, the third fan 123 is mounted at about 45° to the long axis of the ventilation duct 160.

Figure 2:
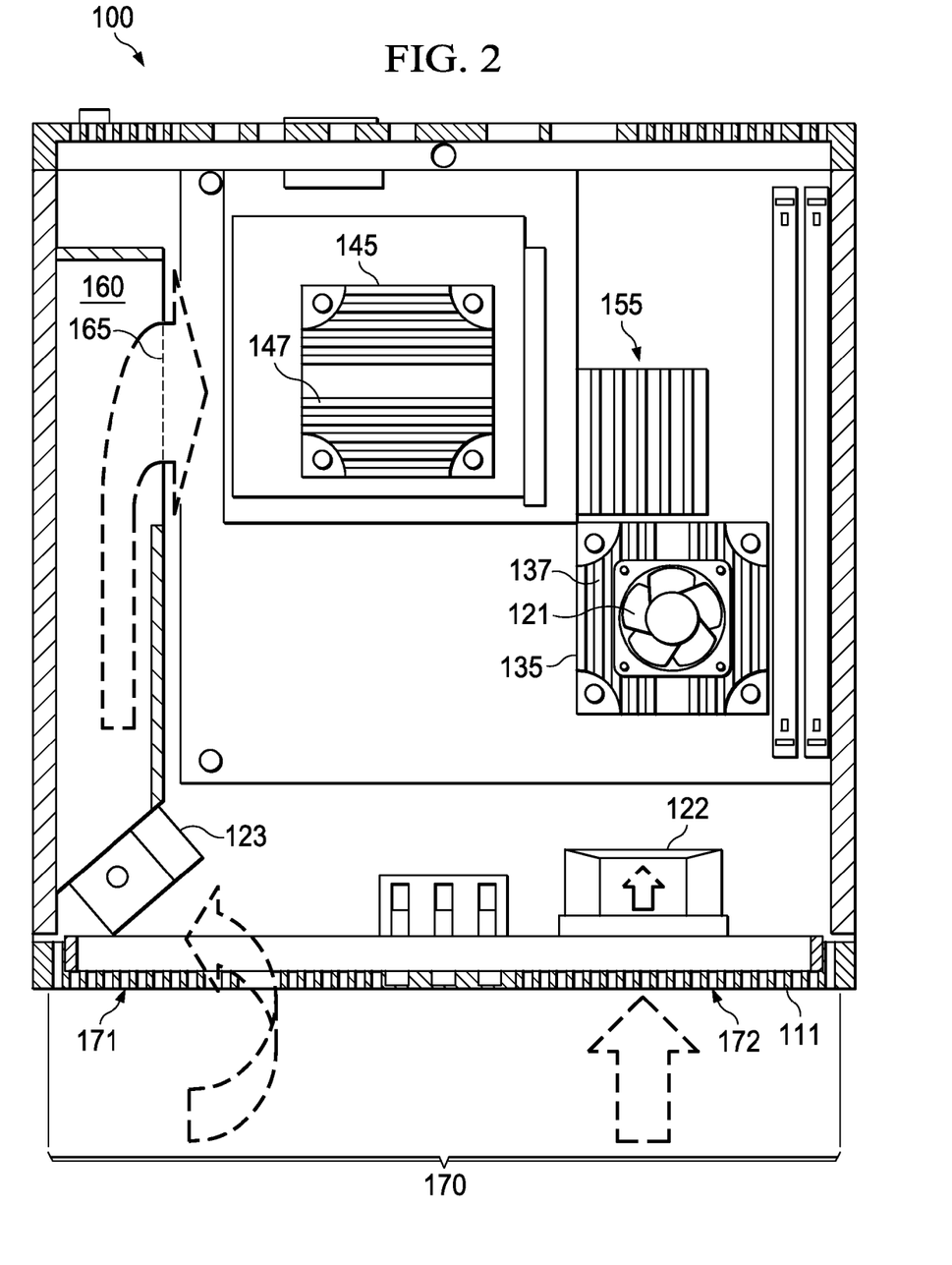
FIG. 2 is plan sectional view showing the flow paths of cooling air as it is circulated through the chassis.
Figure 3:
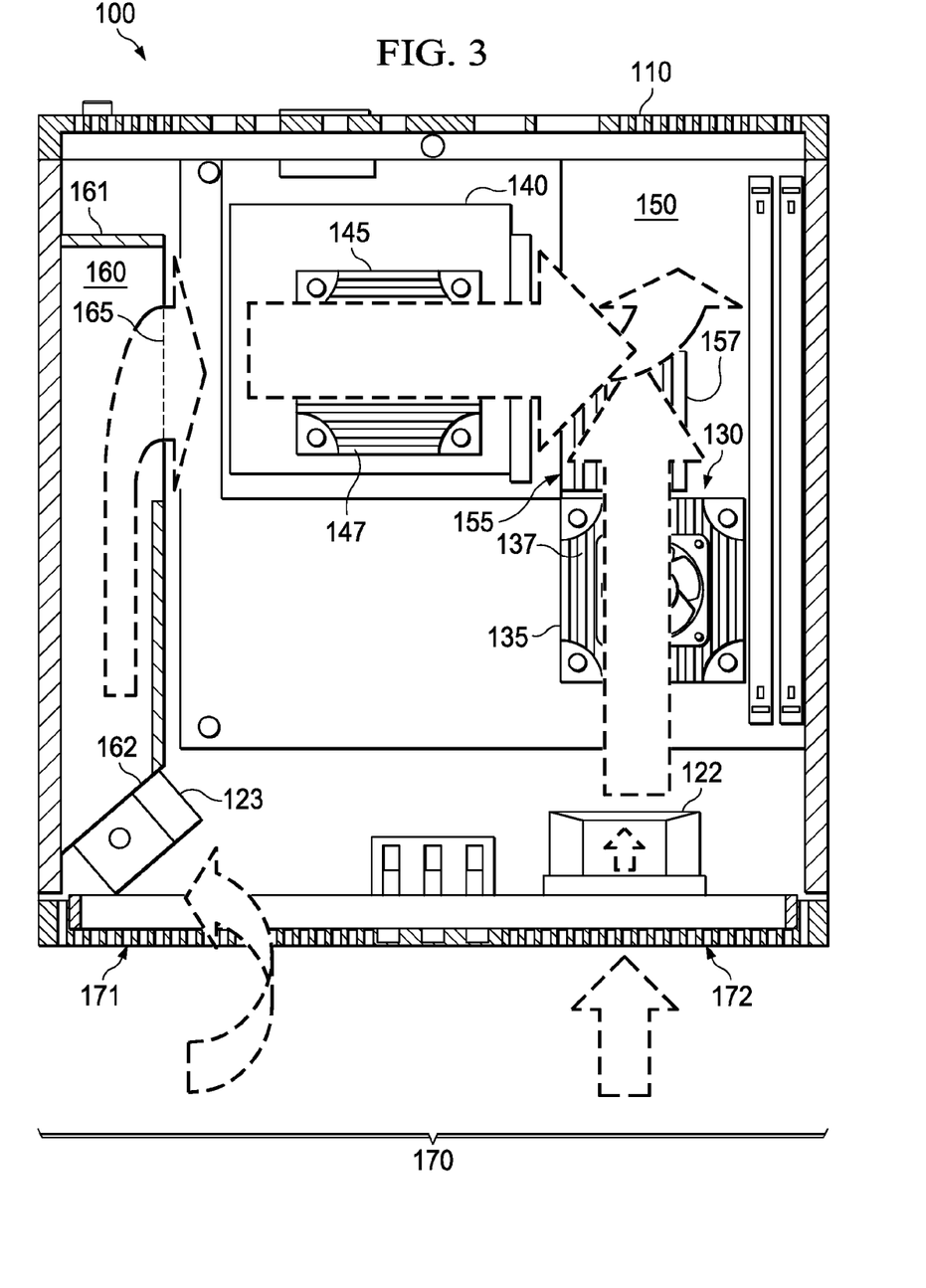
FIG. 3 is a sectional plan view showing more clearly the airflow through the chassis.

Referring now to FIG. 2, illustrated are the flow paths of cooling air as it is circulated through the chassis 100. The first fan 121 primarily draws heat upwardly from the video processor heatsink 135 while the second fan 122 draws in outside air through the second portion 172 of the front side apertures 170 that mixes with the airflow created by the first fan 121 and the combined airflow proceeds across the video processor heatsink 135 and along the fins 137 of the video processor heatsink 135. The third fan 123 draws in outside air through the first portion 171 of the front side apertures 170 and directs the airflow down the ventilation duct 160, through the first opening 165 and across the graphics card heatsink 145 and along the fins 147 of the video processor heatsink 145. This airflow from the graphics card heatsink 145 combines with the airflow from the video processor heatsink 135 proximate the motherboard heatsink 155 and exits through the top ventilation apertures 173 (See FIG. 1A) proximate the motherboard heatsink 155 and the back side 112 ventilation apertures 170. FIG. 3 is a sectional plan view showing more clearly the airflow through the chassis 110.

Figure 4A:
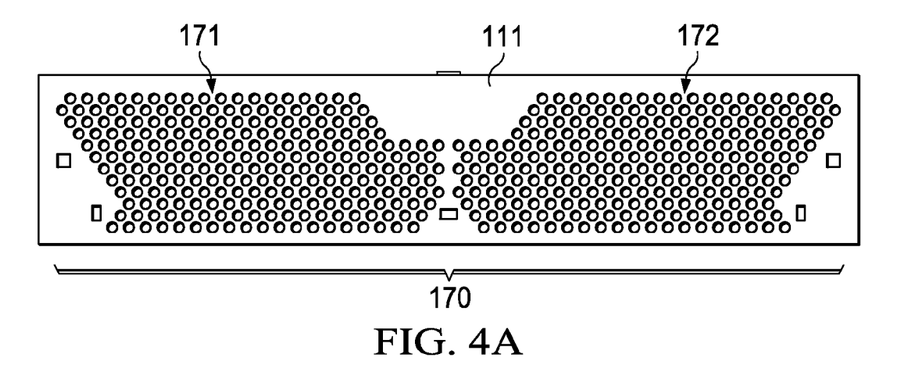
FIG. 4A is an elevation view of the front side of the chassis.

Referring now to FIG. 4A, illustrated is an elevation view of the front side 111 of the chassis 110. Shown are the first portion 171 and the second portion 172 of the front side ventilation apertures 170.

Figure 4B:
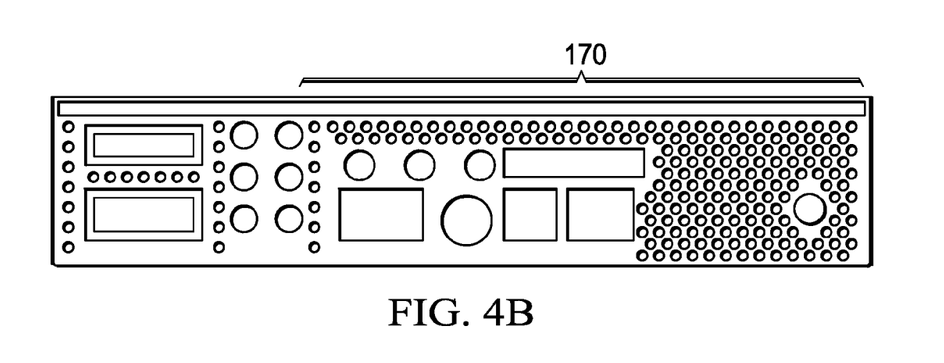
FIG. 4B is an elevation view of the back side of the chassis.

Referring now to FIG. 4B, illustrated is an elevation view of the back side 112 of the chassis 110. Shown are the back side ventilation apertures 170.

Figure 5:
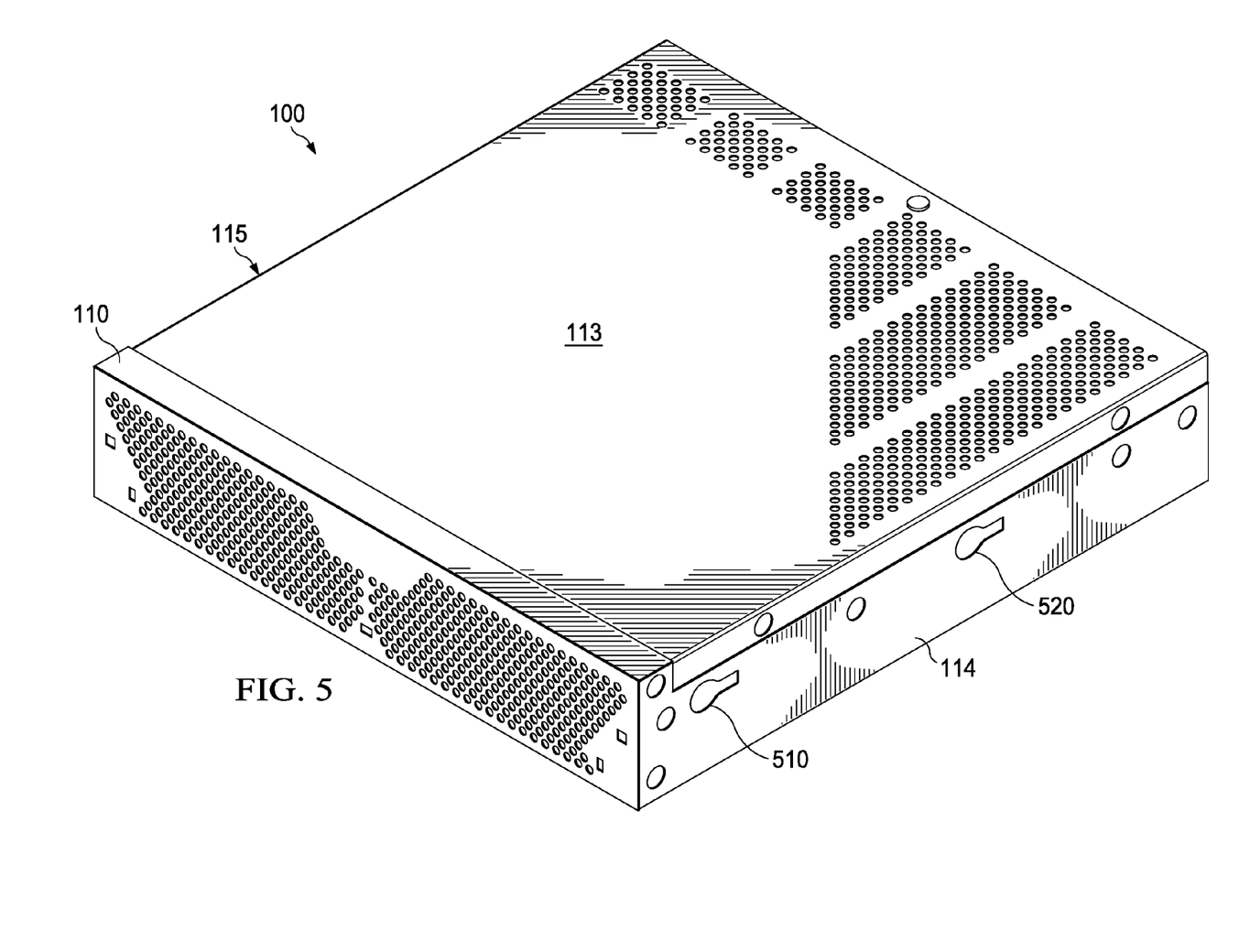
FIG. 5 is an isometric view of the chassis of a video/audio computer display processor.

Referring now to FIG. 5, illustrated is an isometric view of the chassis 110 of a video/audio computer display processor 100. Shown are the top side 113 and the right side 114. The right side 114 comprises a keyway 510 and a latching aperture 520. The functions of the keyway 510 and latching aperture 520 will be discussed below.

Figure 6:
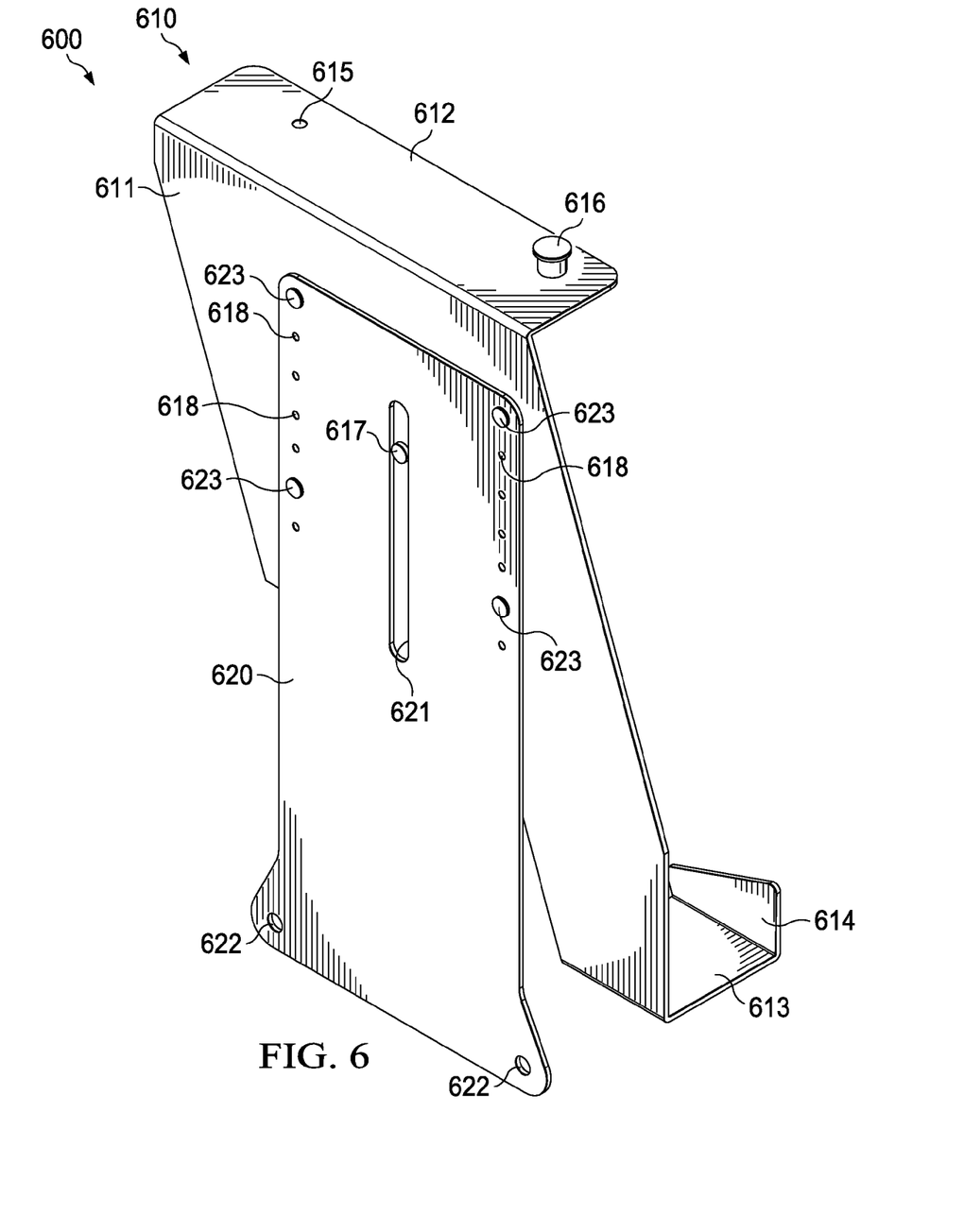
FIG. 6 is an isometric view of a mounting bracket constructed according to the principles of the present invention.

Referring now to FIG. 6, illustrated is an isometric view of a mounting bracket 600 constructed according to the principles of the present invention. The mounting bracket 600 comprises a frame 610 and a mounting plate 620. The frame 610 comprises a frame back 611, a support side 612, an opposing side 613 having an overlapping dog ear tab 614, a headed alignment pin 615, a latch pin 616 and a plate alignment pin 617, and a plurality of threaded screw apertures 618.

The mounting plate 620 comprises a slot 621, and mounting apertures 622. The mounting plate is held to the frame 610 with four machine screws 623 engaging a matching four threaded screw apertures 618 in the frame 610. The mounting apertures 622 provide a means to fasten the mounting bracket 600 to the back of a video/audio computer display (not shown). The headed alignment pin 615 cooperates with the keyway 510 (FIG. 5) when the head of the headed alignment pin 615 enters the large aperture of the keyway 510 and the chassis 110 slides the stem of the headed alignment pin 615 into the narrower slot of the keyway 510. This positions the latch pin 616 to engage the latching aperture 520. The latch pin 616 is spring loaded to hold its engagement with the latching aperture 520.

Figure 7A:
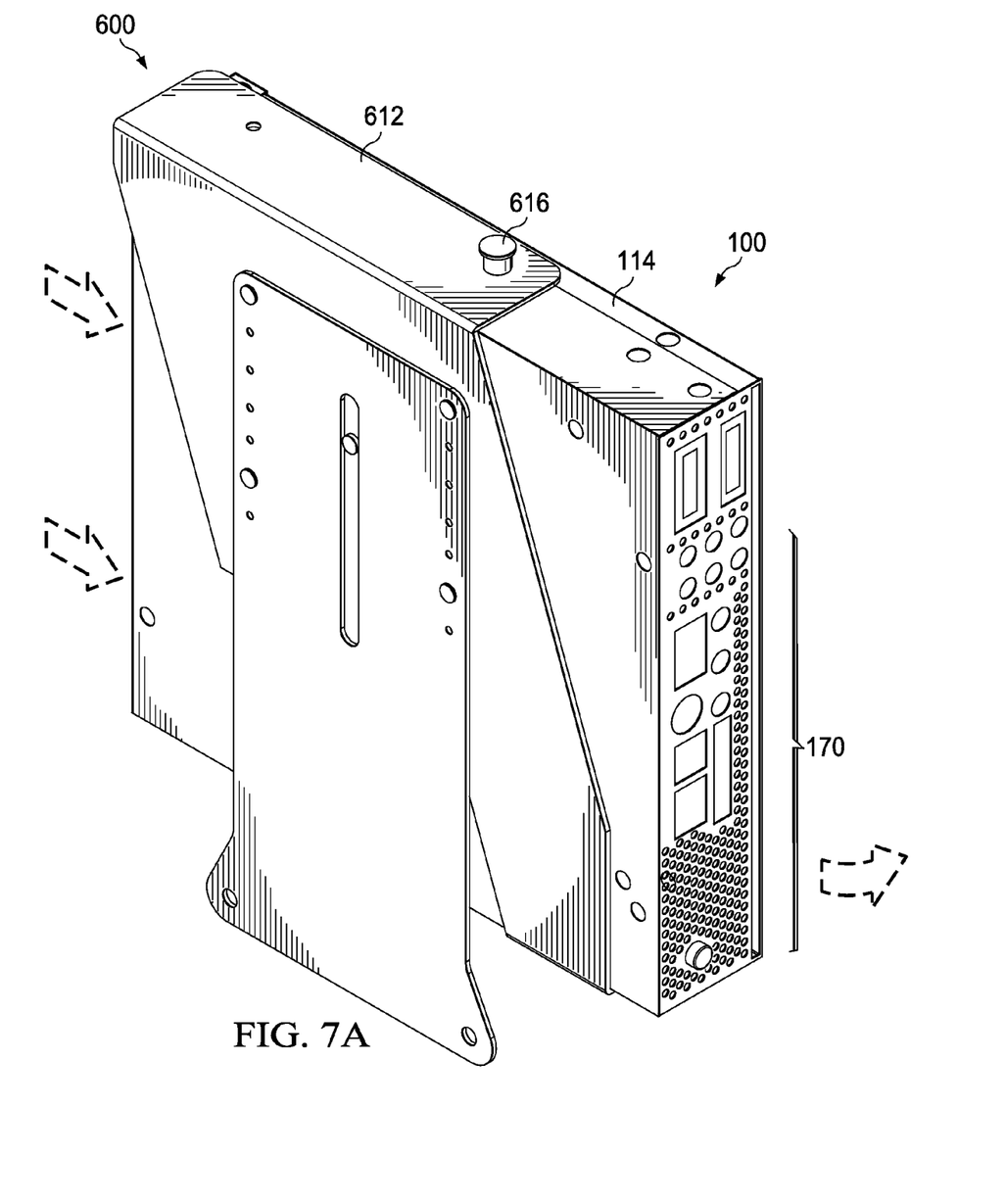
FIG. 7A is a back isometric view of the video/audio computer display processor of FIG. 1 in the mounting bracket of FIG. 6.
Figure 7B:
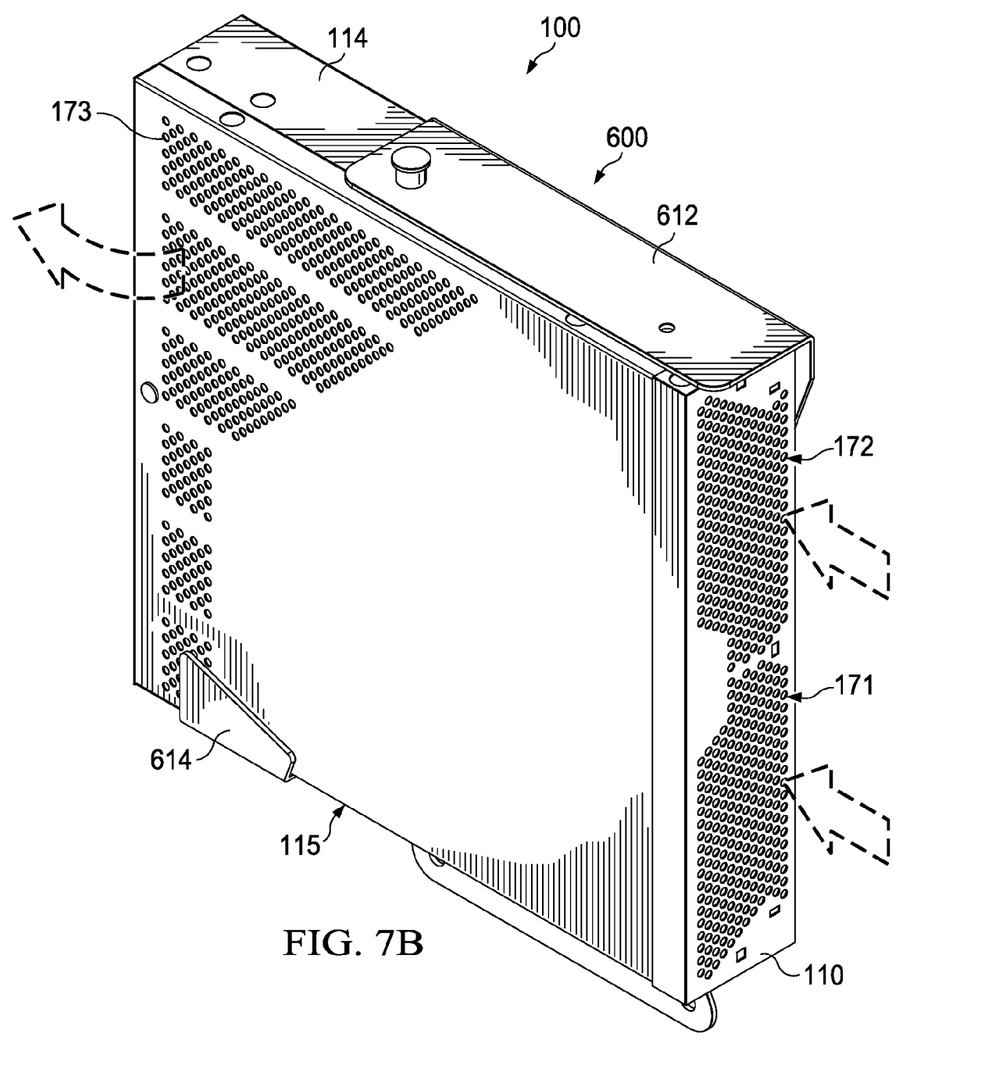
FIG. 7B is a front isometric view of the video/audio computer display processor of FIG. 1 in the mounting bracket of FIG. 6.

Referring now to FIGS. 7A and 7B, illustrated are a back isometric view and a front isometric view, respectively, of the video/audio computer display processor 100 of FIG. 1 in the mounting bracket 600 of FIG. 6. FIGS. 7A and 7B illustrate that the support side 612 engages a majority of the right side 114 of the chassis 110. The left side 115 of the chassis 110 is secured by the overlapping dog ear tab 614. Airflow can be seen to enter the front side ventilation apertures 171, 172 and exit the top side ventilation apertures 173 and the back side ventilation apertures 170.

Figure 8A:
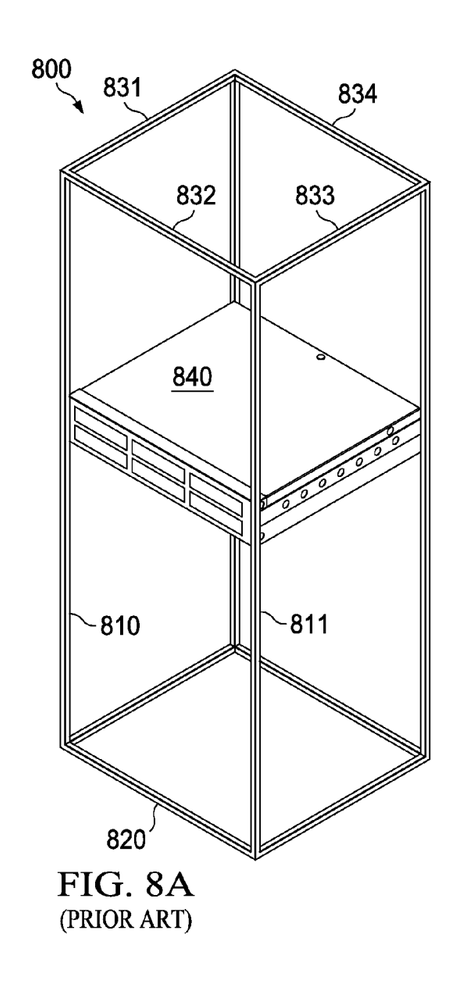
FIG. 8A is an isometric view of a conventional, standard-width server rack with one standard computer 840 located therein.

Referring now to FIG. 8A, illustrated is an isometric view of a conventional, standard-width server rack 800 with one standard computer 840 located therein. The standard-width server rack 800 comprises left and right mounting uprights 810, 811; a base 820; and top braces 831-834. The standard-width server rack 800 is sized to accept one standard computer chassis 840 per each available mounting location. Note that the standard computer chassis 840 extends the full width of the standard-width server rack 800.

Figure 8B:
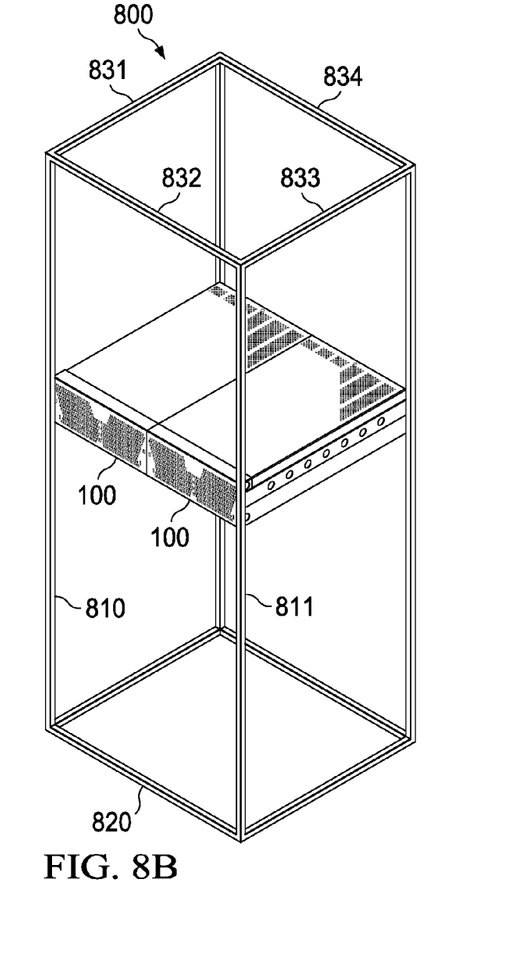
FIG. 8B is an isometric view of the conventional, standard-width server rack of FIG. 8A with two computer chassis as described with reference to FIG. 1A located therein.

Referring now to FIG. 8B, illustrated is an isometric view of the conventional, standard-width server rack 800 of FIG. 8A with two computer chassis 100 as described with reference to FIG. 1A located therein. Note that two computer chassis 100 of the present invention may be coupled together and located in the same space as occupied by one of the standard computers 840 of FIG. 8A.

Thus, a video/audio computer display processor 100 has been described that coupled with a mounting bracket 600 enables the video/audio computer display processor 100 to be mounted to a back of a video/audio computer display while providing significant advantages of cooling airflow for the enclosed electronics.

Those skilled in the art to which this application relates will appreciate that other and further additions, deletions, substitutions and modifications may be made to the described embodiments.

What is claimed is:

1. A video/audio computer display processor, comprising:
   a chassis having first, second and third fans mounted therein;
   a video processor having a processor heatsink mounted thereon, said processor heatsink having fins extending therefrom, said first fan mounted on said processor heatsink and said second fan positioned to direct an airflow parallel to and along said fins of said processor heatsink;
   a graphics card having a graphics card heatsink mounted thereon, said graphics card heatsink having fins extending therefrom; and
   a ventilation duct extending along a side of said chassis, said ventilation duct having an opening therein adjacent said graphics card heatsink, said third fan positioned to direct an airflow through said ventilation duct and out through said opening and parallel to and along fins of said graphics card heatsink.

2. The display processor as recited in claim 1 wherein said chassis has a front panel having a plurality of ventilation apertures therethrough and wherein said third fan is located proximate a first portion of said plurality of front panel ventilation apertures.

3. The display processor as recited in claim 2 wherein said second fan is located proximate a second portion of said plurality of front panel ventilation apertures.

4. The display processor as recited in claim 1 wherein said opening in said ventilation duct is a first opening and said ventilation duct further includes a second opening located on an opposite end of said ventilation duct and wherein said third fan is coupled to said ventilation duct at said second opening and is positioned at an angle of less than 90 degrees with respect to said ventilation duct.

5. The display processor as recited in claim 1 wherein a top of said chassis has ventilation apertures therethrough and wherein said airflow from said graphics card heatsink intersects said airflow from said processor heatsink and exits through said ventilation apertures in said top of said chassis.

6. The display processor as recited in claim 5 further comprising a third heatsink on a motherboard of said display processor and wherein said chassis top ventilation apertures are proximate said third heatsink.

7. The display processor as recited in claim 1 wherein said chassis occupies approximately one-half of a conventional standard-width server rack.

8. A method of manufacturing a video/audio computer display processor, comprising:
    providing a chassis and mounting first, second and third fans therein;
    mounting a video processor in said chassis and mounting a processor heatsink on said video processor, said processor heatsink having fins extending therefrom;
    mounting said first fan on said processor heatsink;
    mounting said second fan to direct an airflow parallel to and along said fins of said processor heatsink;
    mounting a graphics card in said chassis and mounting a heatsink on said graphics card, said graphics card heatsink having fins extending therefrom;
    mounting a ventilation duct to extend along a side of said chassis, said ventilation duct having an opening therein adjacent said graphics card heatsink; and
    mounting said third fan to direct an airflow through said ventilation duct and out through said opening and parallel to and along fins of said graphics card heatsink.

9. The method as recited in claim 8 wherein said chassis has a front panel having a plurality of ventilation apertures therethrough, and further comprising:
    mounting said third fan proximate a first portion of said plurality of front panel ventilation apertures, and configuring said third fan to direct an airflow from said first portion of said plurality of front panel ventilation apertures through said ventilation duct and out through said opening and parallel to said fins of said graphics card heatsink.

10. The method as recited in claim 9 further comprising mounting said second fan proximate a second portion of said plurality of front panel ventilation apertures.

11. The method as recited in claim 8 wherein said opening in said ventilation duct is a first opening and said ventilation duct further includes a second opening located on an opposite end of said ventilation duct and further comprising coupling said third fan to said ventilation duct at said second opening and positioning said third fan at an angle of less than 90 degrees with respect to said ventilation duct.

12. The method as recited in claim 8 further comprising forming ventilation apertures through a top of said chassis and configuring said airflow such that said graphics card heatsink airflow combines with said processor heatsink airflow, and said combined airflow exits through said ventilation apertures in said top of said chassis.

13. The method as recited in claim 12 further comprising mounting a third heatsink on a motherboard of said display processor and wherein said chassis top ventilation apertures are proximate said third heatsink.

14. A video/audio computer display processor system, comprising:
    a chassis having first, second and third fans mounted therein;
    a video processor having a processor heatsink mounted thereon, said processor heatsink having fins extending therefrom, said first fan mounted on said processor heatsink and said second fan positioned to direct an airflow parallel to and along said fins of said processor heatsink;
    a graphics card having a graphics card heatsink mounted thereon, said graphics card heatsink having fins extending therefrom;
    a ventilation duct extending along a side of said chassis, said ventilation duct having an opening therein adjacent said graphics card heatsink, said third fan positioned to direct an airflow through said ventilation duct and out through said opening and parallel to and along fins of said graphics card heatsink; and
    a mounting bracket comprising:
        a frame configured to receive said chassis therewithin; and
        a mounting plate configured to fasten said mounting bracket to a back of a video/audio computer display.

15. The computer display processor system as recited in claim 14 wherein said frame has a support side configured to receive a first side of said chassis.

16. The computer display processor system as recited in claim 15 wherein said frame has a frame back and a second side opposing said support side, and wherein said second side has a dog ear tab normal to said second side and parallel to said frame back.

17. The computer display processor system as recited in claim 15 wherein said support side has a headed alignment pin configured to cooperate with a keyway in said first side of said chassis.

18. The computer display processor system as recited in claim 15 wherein said support side has a latch pin configured to cooperate with a latching aperture in said first side of said chassis.

19. The computer display processor system as recited in claim 18 wherein said latch pin is spring-loaded to engage said latching aperture.

20. The computer display processor system as recited in claim 14 wherein said mounting plate has a slot along a centerline thereof and a plurality of threaded screw apertures spaced apart and parallel to said centerline, and wherein said frame has a plate alignment pin proximate a center thereof and a plurality of screw apertures therethrough, said plate alignment pin configured to cooperate with said slot to position said frame along said mounting plate centerline and align said plurality of screw apertures with a subset of said plurality of threaded screw apertures.

21. The computer display processor system as recited in claim 14 wherein said chassis further comprises a plurality of ventilation apertures in a top thereof, and wherein said airflow is directed through said ventilation apertures and outside of said chassis by said second and third fans.

* * * * *